(12) United States Patent
Jung et al.

(10) Patent No.: US 11,094,663 B2
(45) Date of Patent: Aug. 17, 2021

(54) METHOD FOR TRANSIENT LIQUID-PHASE BONDING BETWEEN METAL MATERIALS USING A MAGNETIC FORCE

(71) Applicant: Research & Business Foundation Sungkyunkwan University, Suwon-si (KR)

(72) Inventors: Seung Boo Jung, Seoul (KR); Kyung Deuk Min, Suwon-si (KR); Kwang Ho Jung, Suwon-si (KR); Choong Jae Lee, Suwon-si (KR); Hak San Jeong, Seoul (KR); Jae Ha Kim, Seoul (KR); Byeong Uk Hwang, Suwon-si (KR)

(73) Assignee: Research and Business Foundation Sungkyunkwan University, Suwon-si (KR)

(*) Notice: Subject to any disclaimer, the term of this patent is extended or adjusted under 35 U.S.C. 154(b) by 0 days.

(21) Appl. No.: 16/869,806

(22) Filed: May 8, 2020

(65) Prior Publication Data
US 2020/0381385 A1 Dec. 3, 2020

(30) Foreign Application Priority Data
Jun. 3, 2019 (KR) .......................... 10-2019-0065101

(51) Int. Cl.
*H01L 23/00* (2006.01)
*H01F 1/03* (2006.01)

(52) U.S. Cl.
CPC .............. *H01L 24/29* (2013.01); *H01L 24/83* (2013.01); *H01F 1/0315* (2013.01); *H01L 2224/832* (2013.01)

(58) Field of Classification Search
None
See application file for complete search history.

(56) References Cited

U.S. PATENT DOCUMENTS

2020/0381385 A1* 12/2020 Jung ...................... H01L 24/83

FOREIGN PATENT DOCUMENTS

KR   10-2009-0047500 A   5/2009

* cited by examiner

*Primary Examiner* — Jack S Chen
(74) *Attorney, Agent, or Firm* — NSIP Law

(57) ABSTRACT

Disclosed is a method for transient liquid-phase bonding between metal materials using a magnetic force. In particular, in the method, a magnetic force is applied to a transient liquid-phase bonding process, thereby shortening a transient liquid-phase bonding time between the metal materials, and obtaining high bonding strength. To this end, an attractive magnetic force is applied to a ferromagnetic base while a repulsive magnetic force is applied to a diamagnetic base, thereby to accelerate diffusion. This may reduce a bonding time during a transient liquid-phase bonding process between two bases and suppress formation of Kirkendall voids and voids and suppress a layered structure of an intermetallic compound, thereby to increase a bonding strength.

3 Claims, 12 Drawing Sheets

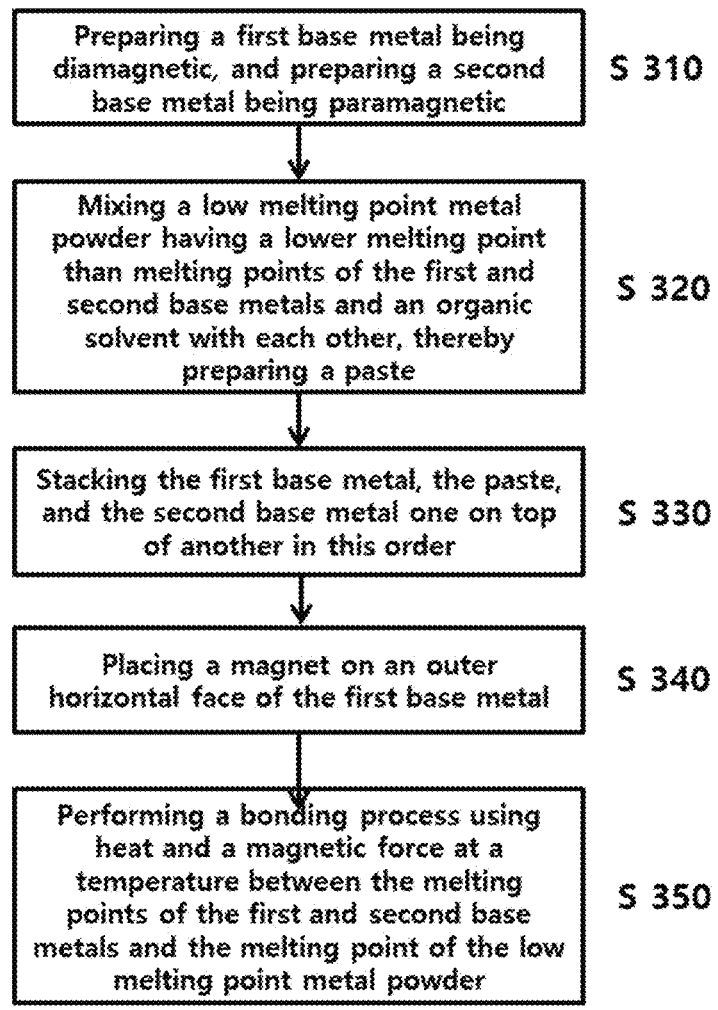

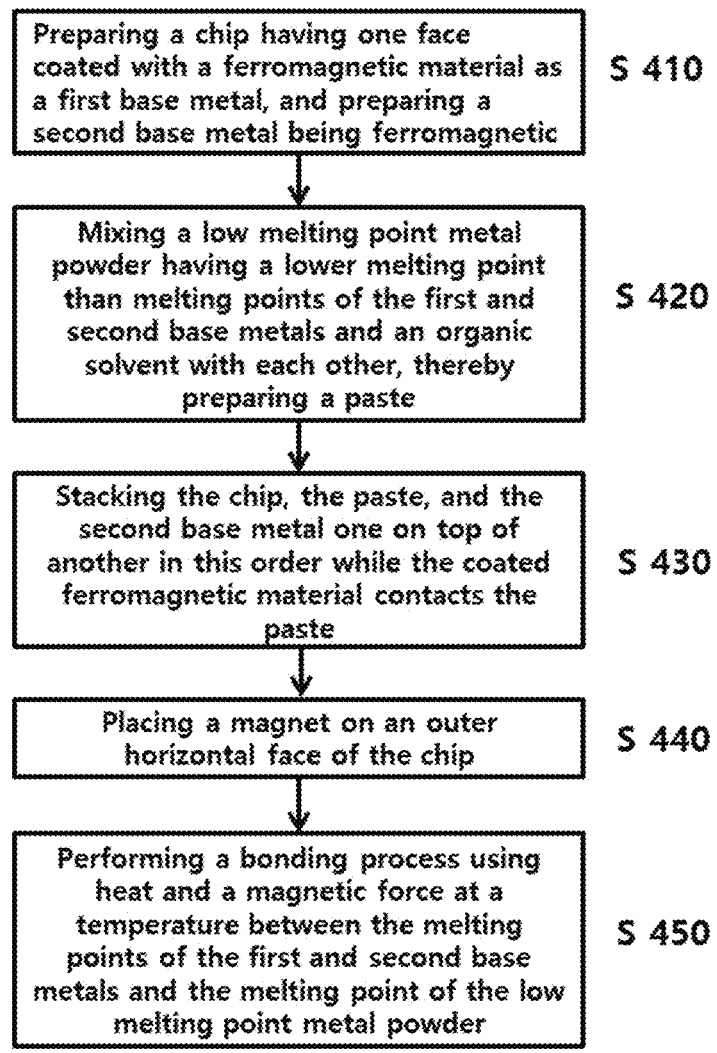

Ferromagnetic (first base metal)

METHOD FOR TRANSIENT LIQUID-PHASE BONDING BETWEEN METAL MATERIALS USING A MAGNETIC FORCE

CROSS-REFERENCE TO RELATED APPLICATION

This application claims a benefit under 35 U.S.C. § 119(a) of Korean Patent Application No. 10-2019-0065101 filed on Jun. 3, 2019, on the Korean Intellectual Property Office, the entire disclosure of which is incorporated herein by reference for all purposes.

BACKGROUND

1. Field

The present disclosure relates to a method for transient liquid-phase bonding between metal materials using a magnetic force. In particular, the present disclosure relates to a method for transient liquid-phase bonding between metal materials in which a magnetic force is applied to a transient liquid-phase bonding process, thereby shortening a transient liquid-phase bonding time between the metal materials, and obtaining high bonding strength.

2. Description of Related Art

Recently, demand for electric vehicles has increased due to environmental pollution regulations. Therefore, research on power modules as important parts therein is underway. Si semiconductors are currently used as power semiconductors in the power modules. However, discussion of application of a SiC chip as a compound semiconductor continues as a next-generation power semiconductor requires high breakdown voltage, power conversion efficiency, and high temperature stability. However, a temperature of the SiC chip increases to a temperature near 250 degrees C. when driving the power module. The is not true of the Si chip. Thus, a previously used bonded material SAC305 (Sn-3.0Ag-0.5Cu, melting point: 217 degrees C.) may not be applied to the SiC chip. Accordingly, research and development for a bonding scheme having heat resistance at high temperatures is required.

In addition, many studies have been conducted to find a stable bonding method at high temperatures in an aerospace field. A first candidate bonding method uses Ag sintering. However, this is expensive in price. A second candidate bonding method uses high temperature soldering. However, Au is contained therein, this approach is also expensive. A transient liquid-phase bonding method which has been widely studied in recent years forms an intermetallic compound via diffusion, and is competitive in price. However, because the bonding requires diffusion, a bonding time is long. Further, Kirkendall voids, and voids are inevitably formed because the intermetallic compound is formed in a non-pressurizing process. Thus, a low bonding strength may be achieved. A conventional shortening approach of the transient liquid-phase bonding time is to increase a temperature to accelerate the diffusion. However, the high temperature causes warpage or deterioration of the module. Thus, the bonding at a high temperature may be not available industrially.

For example, Ni as a metal used for a substrate has resistance to corrosion. Ti/Cu is mainly used for a surface treatment of the SiC chip. Therefore, the most ideal base metal results from bonding between Ni and Cu. Further, there is a need for a bonding method between various homogeneous or dissimilar metal materials in an industry. When the conventional transient liquid-phase bonding method is applied, diffusion is affected only by a time and heat, such that the bonding takes a long time and excessive Kirkendall voids and, voids are formed. In addition, in a bonding process between dissimilar materials, a layered structure is formed inside a joint portion, and a weakness is created in the joint portion.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide a method for transient liquid-phase bonding between bases, in which an attractive magnetic force is applied to a ferromagnetic base, while a magnetic repulsive force is applied to a diamagnetic base to accelerate diffusion, such that a transient liquid-phase bonding time between the bases is reduced, and formation of kirkendall voids and voids is suppressed, and the layered structure of the intermetallic compound is suppressed.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

A first aspect of the present disclosure provides a method for transient liquid-phase bonding between metal materials using a magnetic force, the method comprising: preparing a first base metal being diamagnetic or paramagnetic, and preparing a second base metal being ferromagnetic; mixing a low melting point metal powder having a lower melting point than melting points of the first and second base metals and an organic solvent with each other, thereby preparing a paste; stacking the first base metal, the paste, and the second base metal one on top of another in this order; placing a magnet on an outer horizontal face of the first base metal; and performing a bonding process using heat and a magnetic force at a temperature between the melting points of the first and second base metals and the melting point of the low melting point metal powder.

In one implementation of the first aspect, the organic solvent includes a flux or a mixture of a dispersant and a solvent.

In one implementation of the first aspect, the method further comprises placing an electrical wire on the outer horizontal face of the first base metal such that a magnetic force is generated via electric current flowing in the wire.

A second aspect of the present disclosure provides a method for transient liquid-phase bonding between metal materials using a magnetic force, the method comprising: preparing a first base metal being diamagnetic, and preparing a second base metal being paramagnetic; mixing a low melting point metal powder having a lower melting point than melting points of the first and second base metals and an organic solvent with each other, thereby preparing a paste; stacking the first base metal, the paste, and the second base metal one on top of another in this order; placing a magnet on an outer horizontal face of the first base metal; and performing a bonding process using heat and a magnetic force at a temperature between the melting points of the first and second base metals and the melting point of the low melting point metal powder.

In one implementation of the second aspect, the organic solvent includes a flux or a mixture of a dispersant and a solvent.

In one implementation of the second aspect, the method further comprises placing an electrical wire on the outer horizontal face of the first base metal such that a magnetic force is generated via electric current flowing in the wire.

A third aspect of the present disclosure provides a method for transient liquid-phase bonding between metal materials using a magnetic force, the method comprising: preparing a chip having one face coated with a ferromagnetic material as a first base metal, and preparing a second base metal being ferromagnetic; mixing a low melting point metal powder having a lower melting point than melting points of the first and second base metals and an organic solvent with each other, thereby preparing a paste; stacking the chip, the paste, and the second base metal one on top of another in this order while the coated ferromagnetic material contacts the paste; placing a magnet on an outer horizontal face of the chip; and performing a bonding process using heat and a magnetic force at a temperature between the melting points of the first and second base metals and the melting point of the low melting point metal powder.

In one implementation of the third aspect, the organic solvent includes a flux or a mixture of a dispersant and a solvent.

In one implementation of the third aspect, the method further comprises placing an electrical wire on the outer horizontal face of the chip such that a magnetic force is generated via electric current flowing in the wire.

A fourth aspect of the present disclosure provides a method for transient liquid-phase bonding between metal materials using a magnetic force, the method comprising: preparing a chip having one face coated with a diamagnetic material as a first base metal, and preparing a second base metal being diamagnetic; mixing a low melting point metal powder having a lower melting point than melting points of the first and second base metals and an organic solvent with each other, thereby preparing a paste; stacking the chip, the paste, and the second base metal one on top of another in this order while the coated diamagnetic material contacts the paste; placing a magnet on an outer horizontal face of the second base metal; and performing a bonding process using heat and a magnetic force at a temperature between the melting points of the first and second base metals and the melting point of the low melting point metal powder.

In one implementation of the fourth aspect, the organic solvent includes a flux or a mixture of a dispersant and a solvent.

In one implementation of the fourth aspect, the method further comprises placing an electrical wire on the outer horizontal face of the second base metal such that a magnetic force is generated via electric current flowing in the wire.

A fifth aspect of the present disclosure provides a joint portion between the metal materials, wherein the joint portion is produced using the method of each of the first to fourth aspects.

Effects of the present disclosure are as follows but are not limited thereto.

First, the bonding method according to the present disclosure may use the magnetic force to shorten a long bonding time which has been the greatest disadvantage of the conventional transient liquid-phase bonding method between the metal materials. Second, the bonding method according to the present disclosure may use the magnetic force to allow the Kirkendall voids, and the voids to be reduced to increase bonding reliability. Third, the bonding method according to the present disclosure may use the magnetic force to disallow the formation of the layered structure of the intermetallic compound in the joint portion in a bonding process between heterogeneous materials. Fourth, in a bonding process between homogeneous magnetic materials, the bonding method according to the present disclosure may use the magnetic force to minimize diffusion of the metal in a chip portion while only a metal in a substrate is diffused, thereby to ensure reliability of a transient liquid-phase joint portion.

Therefore, according to the present disclosure, the electrical interconnection bonding occurring at high temperatures, such as the SiC chip bonding in the electric vehicle power modules and the bonding of the electronic components in aerospace may be realized to reduce the bonding time and obtain the high bonding strength.

In addition to the effects as described above, specific effects of the present disclosure are described together with specific details for carrying out the invention.

BRIEF DESCRIPTION OF THE DRAWINGS

FIG. 3A shows a flow chart of a transient liquid-phase bonding method between metal materials using a magnetic force according to a further embodiment of the present disclosure.

FIG. 4A shows a flow chart of a transient liquid-phase bonding method between metal materials using a magnetic force according to a further embodiment of the present disclosure.

DETAILED DESCRIPTIONS

Figure 1:
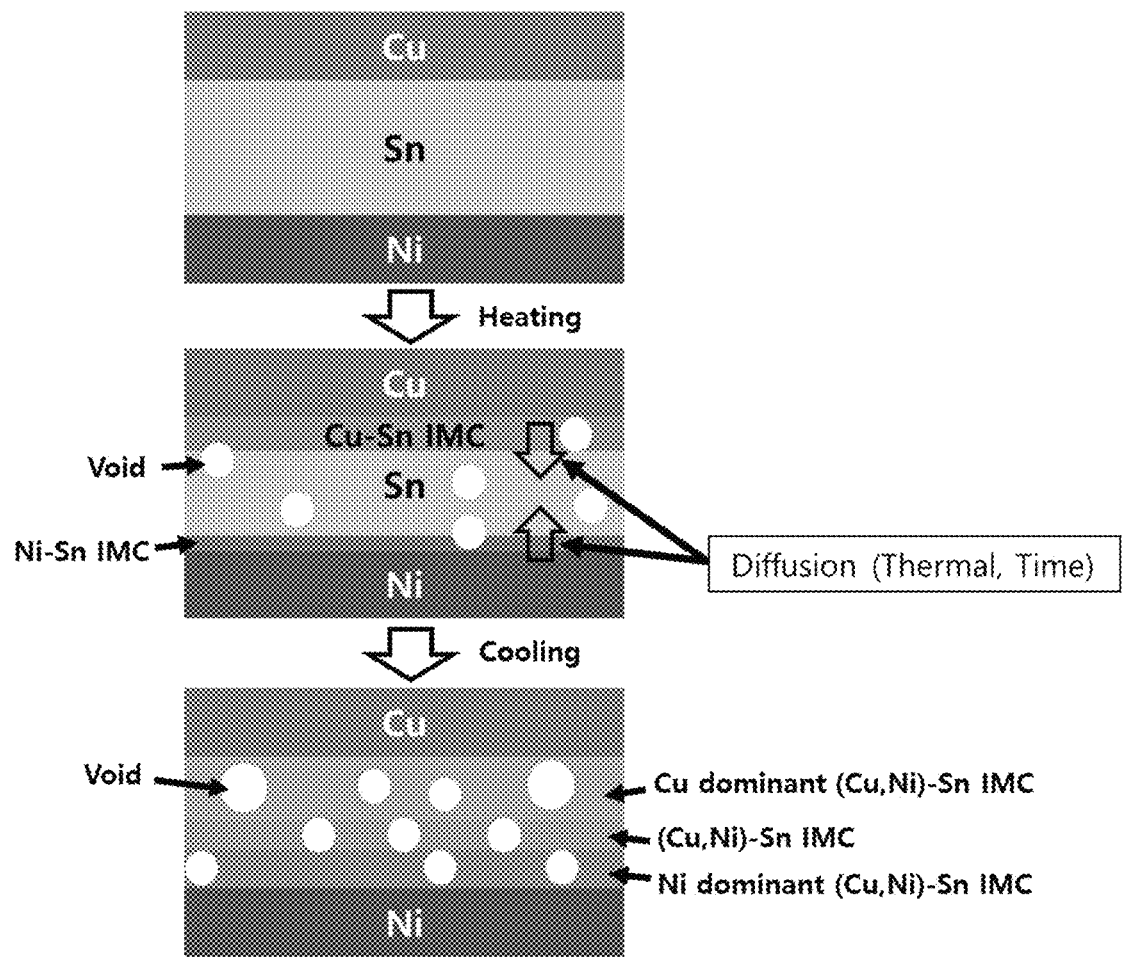
FIG. 1 is a schematic diagram of a conventional unpressurized transient liquid-phase bonding method.

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A transient liquid-phase bonding method bonds a high melting-point metal as a base with a low melting-point metal as a bonded material. The bonding process proceeds at a temperature between the melting points of the low melting-point metal and the high melting-point metal. Thus, the low melting-point metal and the high melting-point metal form an intermetallic compound via mutual diffusion. Since the intermetallic compound has a higher melting point than that of the low melting-point metal, the intermetallic compound does not melt at high temperatures. However, in an unpressurized transient liquid-phase bonding process, the low melting-point metal as the bonded material melts and reacts with the high melting-point metal. This inevitably creates the Kirkendall voids via diffusion. In addition, when the bonding process uses a paste, many voids are generated as an organic solvent is vaporized. Therefore, the Kirkendall voids and the voids may lower a bonding strength. In addition, a process time for the low melting-point metal to react with the high melting-point metal to form the intermetallic compound is exceedingly long.

In particular, when the conventional transient liquid-phase bonding method bonds heterogeneous materials with each other, a layered structure is formed in the bonded section, such that a strength of the bonded section is further lowered. FIG. 1 is a detailed schematic diagram illustrating the conventional transient liquid-phase bonding method and the above problems thereof.

FIG. 1 is a schematic diagram of the conventional unpressurized transient liquid-phase bonding method. When the bonding uses heat, (Cu dominant (Cu, Ni)—Sn) IMC, (Ni dominant (Cu, Ni)—Sn) IMC, and, thus, Kirkendall voids are formed. Further, as an organic solvent is vaporized, general voids are generated. Further, when the intermetallic compound is formed via diffusion, the (Cu dominant (Cu, Ni)—Sn) IMC is mainly formed at an upper portion thereof, while the (Ni dominant (Cu, Ni)—Sn) IMC is mainly formed at a lower portion thereof, while a (Cu, Ni)—Sn IMC is formed in a middle portion thereof. The multi-layers of the intermetallic compound are a major factor in weakening the bonding strength. Further, it takes an exceedingly long time to form the intermetallic compound.

In accordance with the present disclosure, a transient liquid-phase bonding method between metal materials uses various types of magnetic forces. In accordance with the present disclosure, the magnetic force is additionally used in addition to the heat, so that a diamagnetic, paramagnetic or ferromagnetic material is selectively used as a base metal.

One of base metals may constitute a substrate, and the other thereof may constitute a chip. Thus, the chip is mounted on the substrate. Then, both are bonded to each other. In accordance with the present disclosure, one of a first base metal and a second base metal may act as a substrate, and the other thereof may act as a chip.

The diamagnetic material may include C, Cu, Zn, Ga, Ge, Ag, Cd, Sb, Au, Hg, Pb, Bi, Po, Rn, or combinations thereof, and may include a combination between a diamagnetic material and other types of magnetic materials.

The paramagnetic material may include Sn, Pd, W, Mo, Pt, In, Al, or a combination thereof, and may include a combination between a paramagnetic material and other types of magnetic materials.

The ferromagnetic material may include Cr, Mn, Fe, Co, Ni, Ce, Nd, $Fe_2O_3$, $FeOFe_2O_3$, $NiOFe_2O_3$, $CuOFe_2O_3$, $MgOFe_2O_3$, MnBi, MnSb, $MnOFe_2O_3$, $Y_3Fe_5O_{12}$, $CrO_2$, MnAs, EuO, ferrite material or a combination thereof, and may include a combination between a ferromagnetic material and other types of magnetic materials.

A paste is disposed between the base metals. The paste may be obtained by mixing a low-melting-point metal powder having a lower melting point than the base metals with an organic solvent. The low melting point metal powder means a metal powder having a lower melting point than the base metals.

The organic solvent may include a flux or may include a dispersant and a solvent. The flux or the dispersant and solvent are mixed with the metal powers when preparing the paste, thereby to prevent oxidation of the metal powders and facilitate printing thereof.

The dispersant may include a PVP. Water, alcohol, ethylene glycol, etc. may be used as the solvent.

When the flux is used as the organic solvent, a de-flux process may be performed to remove residual flux after performing a bonding process.

Hereinafter, a transient liquid-phase bonding method between metal materials using four different magnetic forces will be described in order. In this case, repeated descriptions of parts common to each other will be omitted. The description will be mainly focused on features.

Case 1) Arrangement of Magnet/Diamagnetic or Paramagnetic Material/Paste/Ferromagnetic Material In a first embodiment, a diamagnetic or paramagnetic material is used as a first base metal, a ferromagnetic material is used as a second base metal, and a magnet is disposed on an outer horizontal face of the first base metal.

Figure 2A:
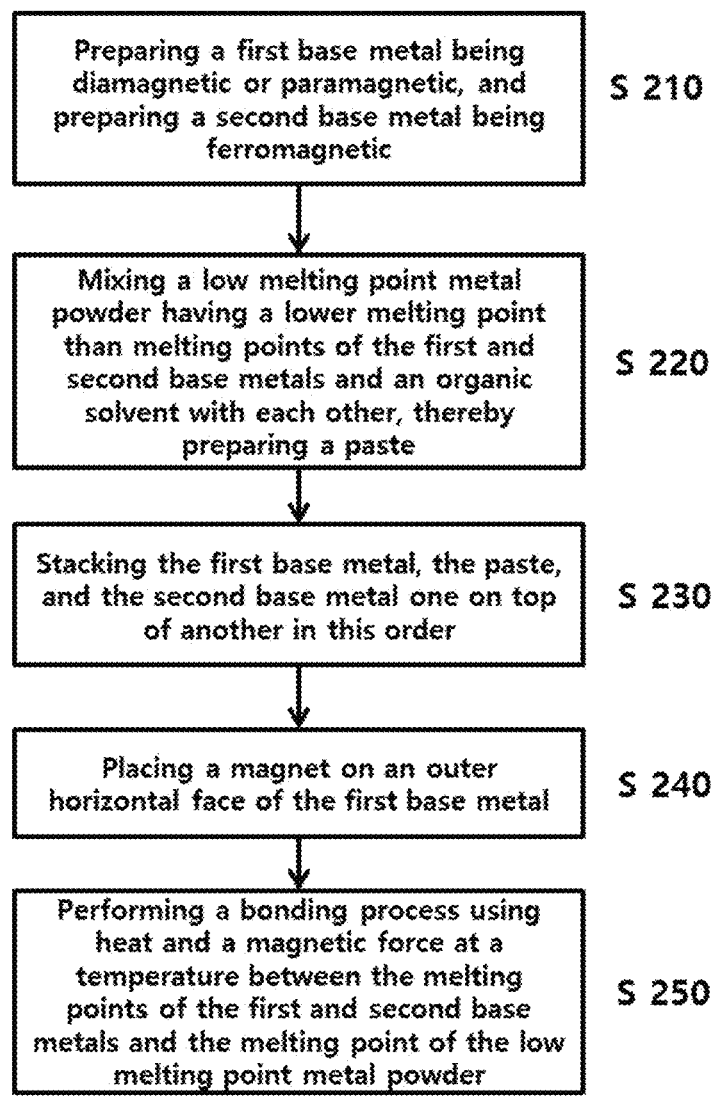
FIG. 2A shows a flow chart of a transient liquid-phase bonding method between metal materials using a magnetic force according to an embodiment of the present disclosure.

FIG. 2A shows a flow chart of a transient liquid-phase bonding method between metal materials using a magnetic force according to an embodiment of the present disclosure. FIG. 2B to FIG. 2E show schematic diagrams of specific implementations thereof.

A transient liquid-phase bonding method between metal materials using a magnetic force according to an embodiment of the present disclosure includes preparing a first base metal that is diamagnetic or paramagnetic, and preparing a second base metal that is ferromagnetic (S 210); mixing a low melting point metal powder having a lower melting point than the first and second base metals and an organic solvent with each other, thereby preparing a paste (S 220); stacking the first base metal, the paste, and the second base metal one on top of another in this order (S 230); placing a magnet on an outer horizontal face of the first base (S 240); and performing a bonding process using heat and a magnetic force at a temperature between a melting point of the base metals and a melting point of the low melting point metal powder (S 250).

In this case, the organic solvent may use a flux or a mixture of a dispersant and a solvent.

In one example, an electrical wire may be disposed on or above the outer horizontal face of the first base. Thus, a magnetic force may be generated via electric current flowing in the wire. The wire may be used instead of the magnet or may be used in combination with the magnet.

Figure 2B:
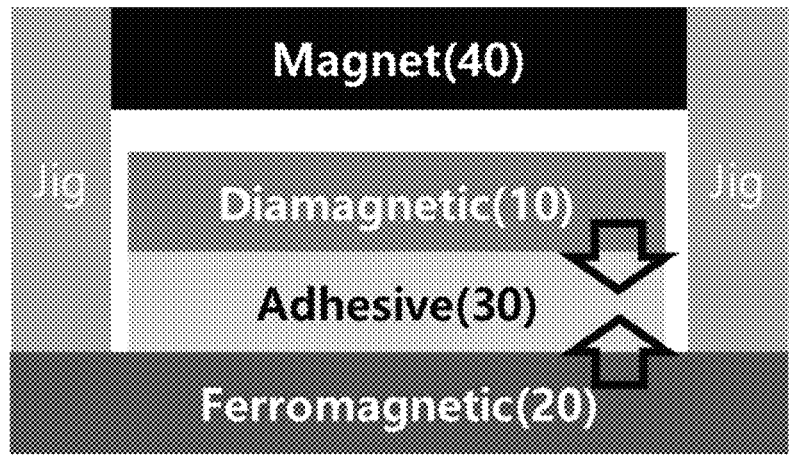
FIG. 2B to FIG. 2E show schematic diagrams of specific implementations thereof.

In FIG. 2B, the magnet 40 is located at a top. The diamagnetic material as the upper first base metal 10 is stacked over the ferromagnetic material as the lower second base metal 20 while the paste as the adhesive material 30 is interposed therebetween. The paste may be made of a paramagnetic material and may be formed of a thin film. The magnet 40 is disposed on or above an outer top face of the first base 10.

The ferromagnetic material is rapidly diffused to a joint portion via an attractive magnetic force with the magnet, while the diamagnetic material is rapidly diffused to the joint portion via a repulsive magnetic force with the magnet. Thus, 1) the voids may be reduced in the joint portion, 2) mixing between the materials may occur in an entire region of the joint portion, thereby to achieve a uniform composition, and 3) a bonding time may be smaller because the diffusion may rapidly occur.

Figure 2C:
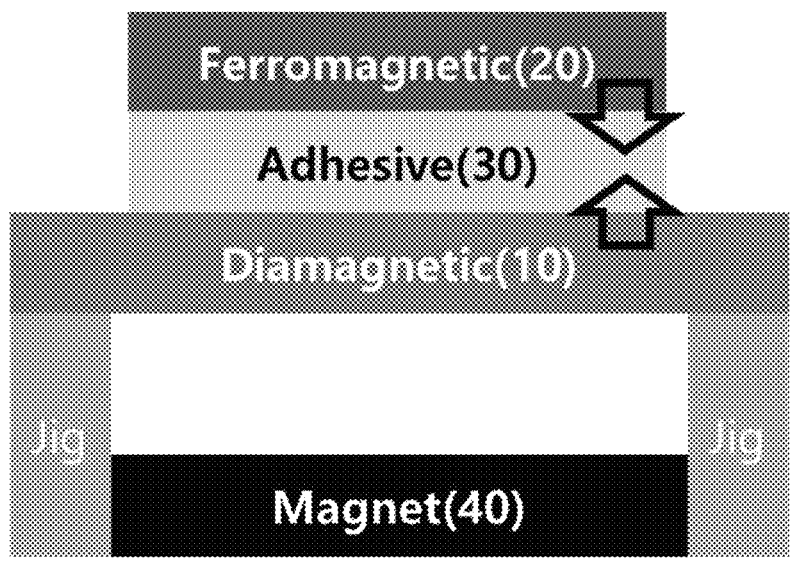

In FIG. 2C, the magnet 40 is located at a bottom. The diamagnetic material 10 as the first lower base is disposed under the ferromagnetic material 20 as the upper second base while the adhesive material 30 is interposed therebetween. The paste may be made of a paramagnetic material and may be formed of a thin film. The magnet 40 is disposed on or under an outer bottom face of the first base 10.

The ferromagnetic material is rapidly diffused to a joint portion via an attractive magnetic force with the magnet, while the diamagnetic material is rapidly diffused to the joint portion via a repulsive magnetic force with the magnet. Thus, 1) the voids may be reduced in the joint portion, 2) mixing between the materials may occur in an entire region of the joint portion, thereby to achieve a uniform composition, and 3) a bonding time may be smaller because the diffusion may rapidly occur.

Figure 2D:
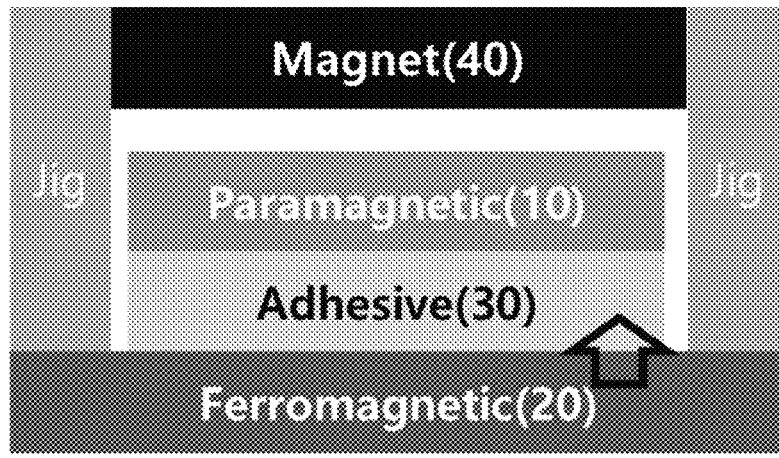

In FIG. 2D, the magnet 40 is located at a top. The paramagnetic material as the upper first base metal 10 is stacked over the ferromagnetic material as the lower second base metal 20 while the paste as the adhesive material 30 is interposed therebetween. The paste may be made of a paramagnetic material and may be formed of a thin film. The magnet 40 is disposed on or above an outer top face of the first base 10.

The ferromagnetic material is rapidly diffused to a joint portion via an attractive magnetic force with the magnet. Thus, 1) the voids may be reduced in the joint portion, 2) mixing between the materials may occur in an entire region of the joint portion, thereby to achieve a uniform composition, and 3) a bonding time may be smaller because the diffusion may rapidly occur.

Figure 2E:
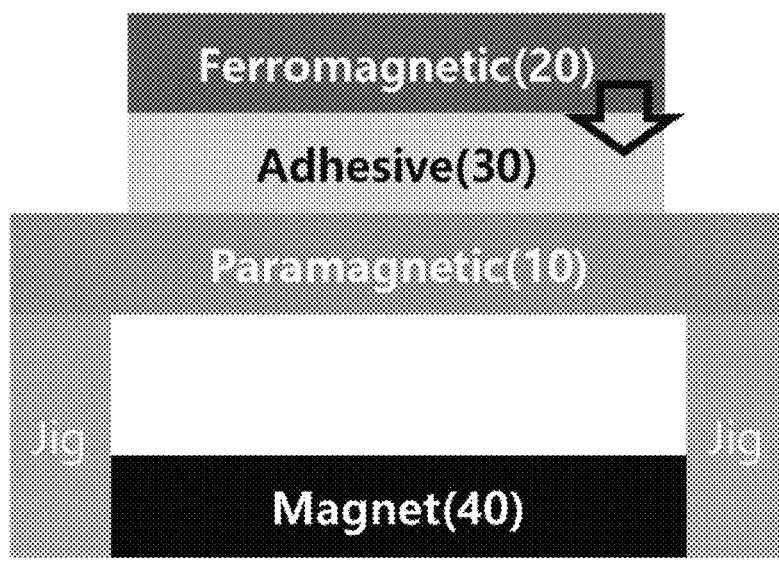

In FIG. 2E, the magnet 40 is located at a bottom. The paramagnetic material 10 as the first lower base is disposed under the ferromagnetic material 20 as the upper second base while the adhesive material 30 is interposed therebetween. The paste may be made of a paramagnetic material and may be formed of a thin film. The magnet 40 is disposed on or under an outer bottom face of the first base 10.

The ferromagnetic material is rapidly diffused to a joint portion via an attractive magnetic force with the magnet. Thus, 1) the voids may be reduced in the joint portion, 2) mixing between the materials may occur in an entire region of the joint portion, thereby to achieve a uniform composition, and 3) a bonding time may be smaller because the diffusion may rapidly occur.

Case 2) Arrangement of Magnet/Diamagnetic Material/Paste/Paramagnetic Material

In a second embodiment, the diamagnetic material is used as the first base metal, the paramagnetic material is used as the second base metal, and the magnet is disposed on an outer horizontal face of the first base metal.

Figure 3B:
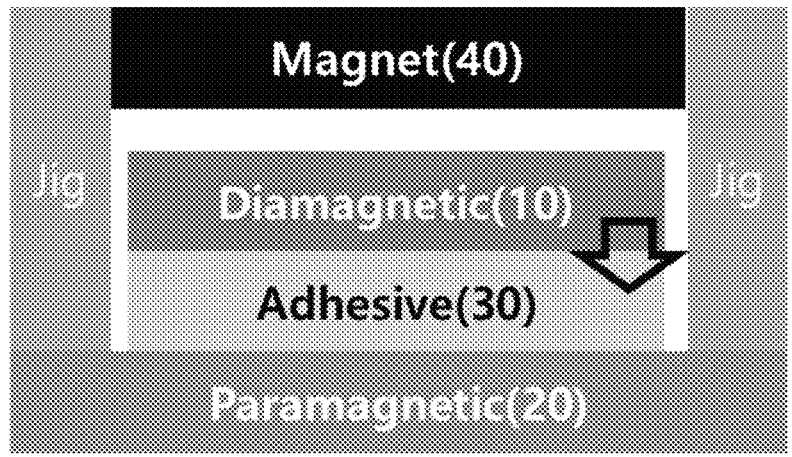
FIG. 3B to FIG. 3C show schematic diagrams of specific implementations thereof.
Figure 3C:
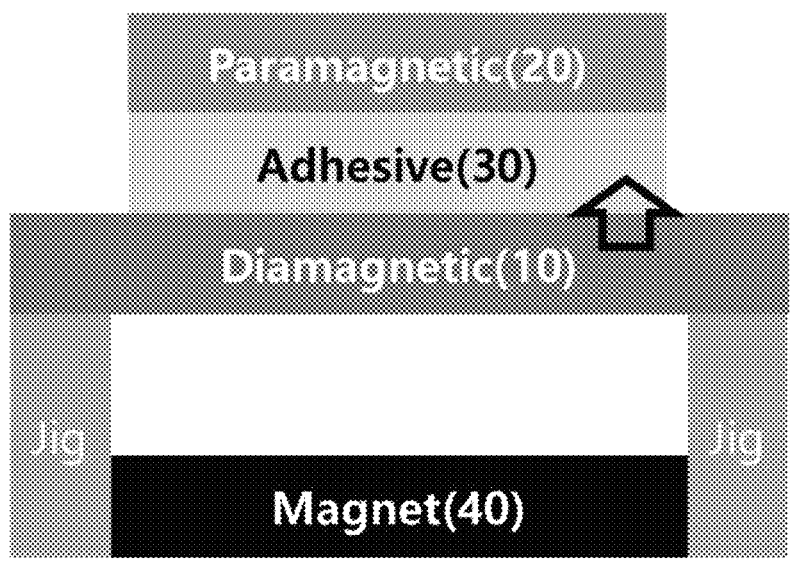

FIG. 3A shows a flow chart of a transient liquid-phase bonding method between metal materials using a magnetic force according to a further embodiment of the present disclosure. FIG. 3B to FIG. 3C show schematic diagrams of specific implementations thereof.

A transient liquid-phase bonding method between metal materials using a magnetic force according to a further embodiment of the present disclosure includes preparing a first base metal that is diamagnetic, and preparing a second base metal that is paramagnetic (S 310); mixing a low melting point metal powder having a lower melting point than the first and second base metals and an organic solvent with each other, thereby preparing a paste (S 320); stacking the first base metal, the paste, and the second base metal one on top of another in this order (S 330); placing a magnet on an outer horizontal face of the first base (S 340); and performing a bonding process using heat and a magnetic force at a temperature between a melting point of the base metals and a melting point of the low melting point metal powder (S 350).

In this case, the organic solvent may use a flux or a mixture of a dispersant and a solvent.

In one example, an electrical wire may be disposed on or above the outer horizontal face of the first base. Thus, a magnetic force may be generated via electric current flowing in the wire. The wire may be used instead of the magnet or may be used in combination with the magnet.

In FIG. 3B, the magnet 40 is located at a top. The diamagnetic material as the upper first base metal 10 is stacked over the paramagnetic material as the lower second base metal 20 while the paste as the adhesive material 30 is interposed therebetween. The paste may be made of a paramagnetic material and may be formed of a thin film. The magnet 40 is disposed on or above an outer top face of the first base metal 10.

The diamagnetic material is rapidly diffused to the joint portion via a repulsive magnetic force with the magnet. Thus, 1) the voids may be reduced in the joint portion, 2) mixing between the materials may occur in an entire region of the joint portion, thereby to achieve a uniform composition, and 3) a bonding time may be smaller because the diffusion may rapidly occur.

In FIG. 3C, the magnet 40 is located at a bottom. The diamagnetic material 10 as the first lower base is disposed under the paramagnetic material 20 as the upper second base while the adhesive material 30 is interposed therebetween. The paste may be made of a paramagnetic material and may be formed of a thin film. The magnet 40 is disposed on or under an outer bottom face of the first base 10.

The diamagnetic material is rapidly diffused to the joint portion via a repulsive magnetic force with the magnet. Thus, 1) the voids may be reduced in the joint portion, 2) mixing between the materials may occur in an entire region of the joint portion, thereby to achieve a uniform composition, and 3) a bonding time may be smaller because the diffusion may rapidly occur.

Case 3) Arrangement of Magnet/Chip Having One Face Coated with Ferromagnetic Material/Paste/Ferromagnetic Base In a third embodiment, a chip having one face coated with a ferromagnetic material as the first base metal is stacked over the second base metal made of a ferromagnetic material while a paste is interposed therebetween. The magnet is disposed on or above an outer horizontal face of the chip.

Figure 4B:
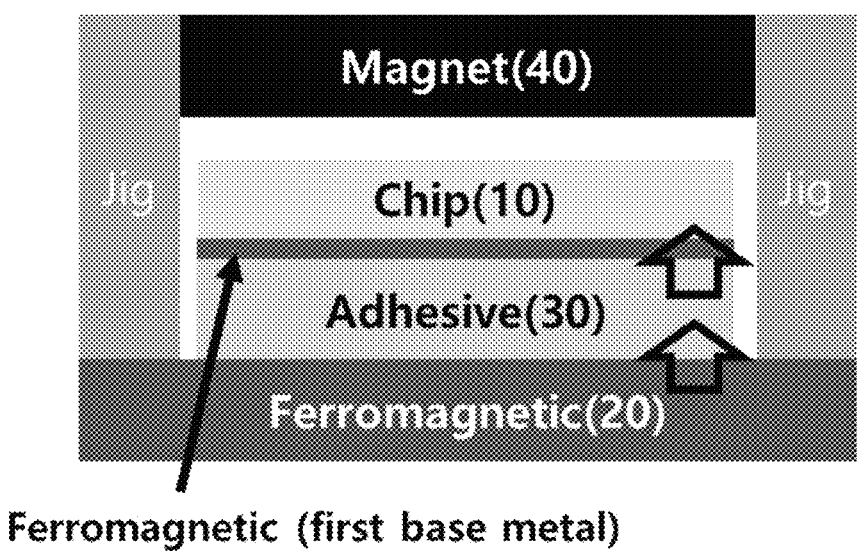
FIG. 4B shows a schematic diagram of a specific implementation thereof.

FIG. 4A shows a flow chart of a transient liquid-phase bonding method between metal materials using a magnetic force according to an additional embodiment of the present disclosure. FIG. 4B shows a schematic diagram of a specific implementations thereof.

A transient liquid-phase bonding method between metal materials using a magnetic force according to an additional embodiment of the present disclosure includes preparing a chip having one face coated with a ferromagnetic material as the first base metal, and preparing a ferromagnetic second base metal (S 410); mixing a low melting point metal powder having a lower melting point than the first and second base metals and an organic solvent with each other, thereby preparing a paste (S 420); stacking the chip, the paste, and the second base metal one on top of another in this order while the coated ferromagnetic material contacts the paste (S 430); placing a magnet on an outer horizontal face of the chip (S 440); and performing a bonding process using heat and a magnetic force at a temperature between a melting point of the base metals and a melting point of the low melting point metal powder (S 450).

In this case, the organic solvent may use a flux or a mixture of a dispersant and a solvent.

In one example, an electrical wire may be disposed on or above the outer horizontal face of the chip. Thus, a magnetic force may be generated via electric current flowing in the wire. The wire may be used instead of the magnet or may be used in combination with the magnet.

In FIG. 4B, the magnet 40 is located at a top. The chip 10 having one face coated with a ferromagnetic material as the first base metal is stacked over the ferromagnetic material as the lower second base metal 20 while the paste as the adhesive material 30 is interposed therebetween. The paste may be made of a paramagnetic material and may be formed of a thin film. The magnet 40 is disposed on or above an outer top face of the chip 10.

When an entirety of the chip is not ferromagnetic and, for example, a Si/Ti/Cu/Ni is coated on one face of the chip, the coating is thin and thus Ni in the chip surface is completely exhausted, such that delamination occurs in the coating of the chip. To prevent this situation, the magnet is placed on the chip having one face coated with a ferromagnetic material as the first base metal. Thus, during the bonding process, the joint portion reacts with Ni in the chip surface in a negligible manner (due to an attractive magnetic force between the magnet and Ni in the surface of the chip). An attractive magnetic force acts on Ni in the substrate, that is, the second base 20. Thus, the bonding may proceed while consuming only Ni in the substrate 20.

Ni in the ferromagnetic material of the coating of the chip is hardly exhausted by the magnet. Thus, the bonding reliability is secured. Ni in only in the lower ferromagnetic base 20 as the substrate may be consumed, such that the voids may be reduced.

Case 4) Arrangement of Chip Having One Face Coated with Diamagnetic Material/Paste/Diamagnetic Base/Magnet In a fourth embodiment, a chip having one face coated with a diamagnetic material as the first base metal is stacked over the second base metal made of a diamagnetic material while a paste is interposed therebetween. The magnet is disposed on or under an outer horizontal face of the second base.

Figure 5A:
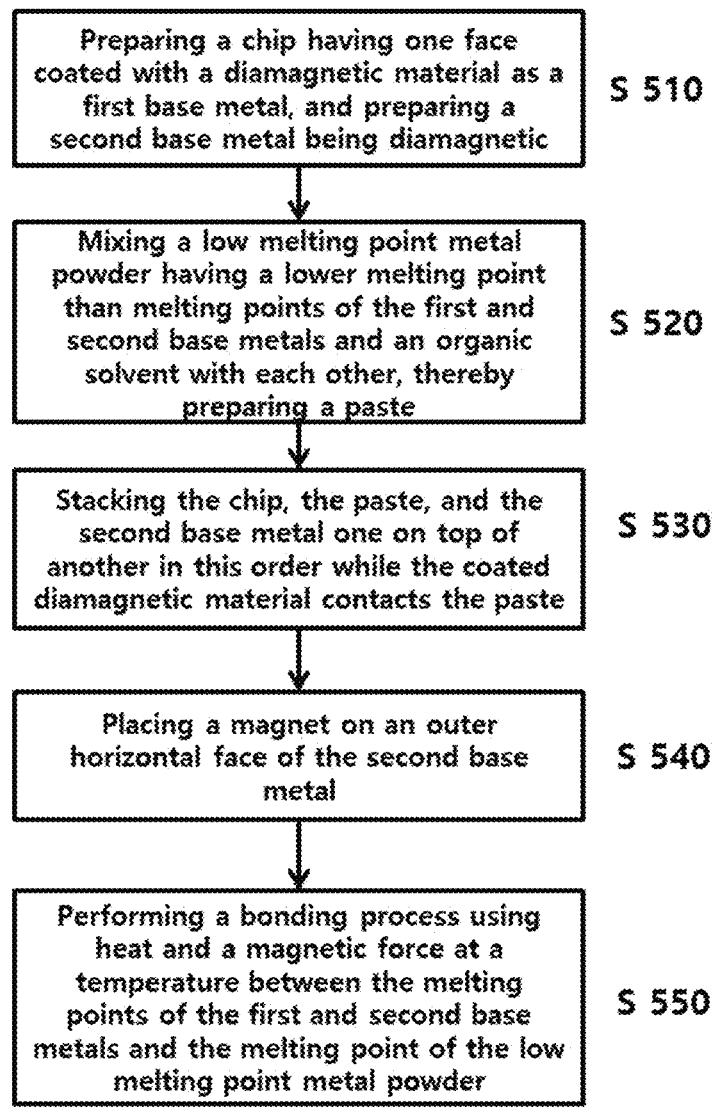
FIG. 5A shows a flow chart of a transient liquid-phase bonding method between metal materials using a magnetic force according to a further embodiment of the present disclosure.
Figure 5B:
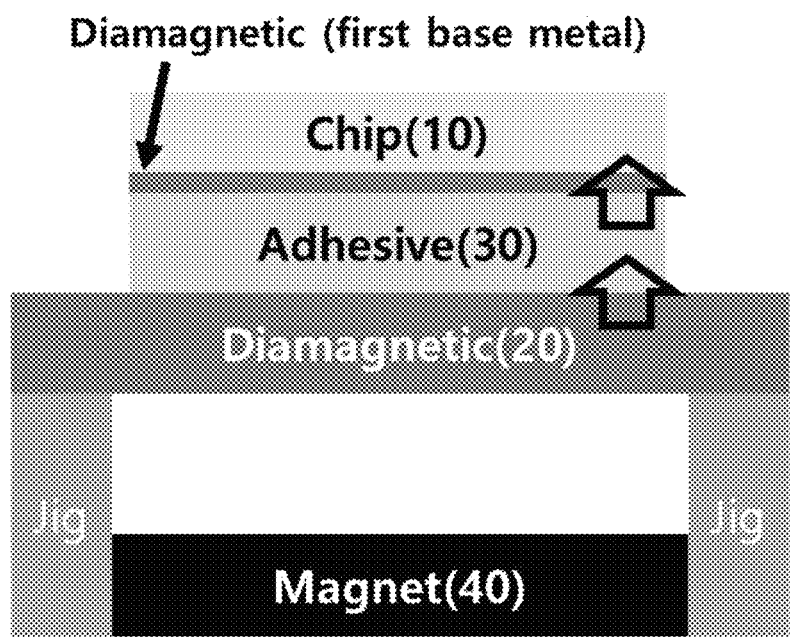
FIG. 5B shows a schematic diagram of a specific implementation thereof.

FIG. 5A shows a flow chart of a transient liquid-phase bonding method between metal materials using a magnetic force according to an additional embodiment of the present disclosure. FIG. 5B shows a schematic diagram of a specific implementations thereof.

A transient liquid-phase bonding method between metal materials using a magnetic force according to an additional embodiment of the present disclosure includes preparing a chip having one face coated with a diamagnetic material as the first base metal, and preparing a diamagnetic second base metal (S 510); mixing a low melting point metal powder having a lower melting point than the first and second base metals and an organic solvent with each other, thereby preparing a paste (S 520); stacking the chip, the paste, and the second base metal one on top of another in this order while the coated diamagnetic material contacts the paste (S 530); placing a magnet on an outer horizontal face of the second base metal (S 540); and performing a bonding process using heat and a magnetic force at a temperature between a melting point of the base metals and a melting point of the low melting point metal powder (S 550).

In this case, the organic solvent may use a flux or a mixture of a dispersant and a solvent.

In one example, an electrical wire may be disposed on or under the outer horizontal face of the second base metal. Thus, a magnetic force may be generated via electric current flowing in the wire. The wire may be used instead of the magnet or may be used in combination with the magnet.

In FIG. 5B, the magnet 40 is located at a bottom. The chip 10 having one face coated with a diamagnetic material as the first base metal is stacked over the diamagnetic material as the lower second base metal 20 while the paste as the adhesive material 30 is interposed therebetween. The paste may be made of a paramagnetic material and may be formed of a thin film. The magnet 40 is disposed on or below an outer bottom face of the second base metal 10.

As shown in FIG. 5B, when an entirety of the chip is not diamagnetic and, for example, a Si/Ti/Cu is coated on one face of the chip, the coating is thin and thus Cu in the chip surface is completely exhausted, such that delamination occurs in the coating of the chip. To prevent this situation, the magnet is placed under the second base made of a diamagnetic material. Thus, during the bonding process, the joint portion reacts with Cu in the chip surface in a negligible manner (due to a repulsive magnetic force between the magnet and Cu in the surface of the chip). A repulsive magnetic force acts on Cu in the substrate, that is, the second base 20. Thus, the bonding may proceed while consuming only Cu in the substrate 20.

Cu in the diamagnetic material of the coating of the chip is hardly exhausted by the magnet. Thus, the bonding reliability is secured. Cu in only in the lower diamagnetic base 20 as the substrate may be consumed, such that the voids may be reduced.

Hereinafter, examples of the present disclosure will be described. However, the present disclosure is not limited thereto.

[Example 1]

Figure 6:
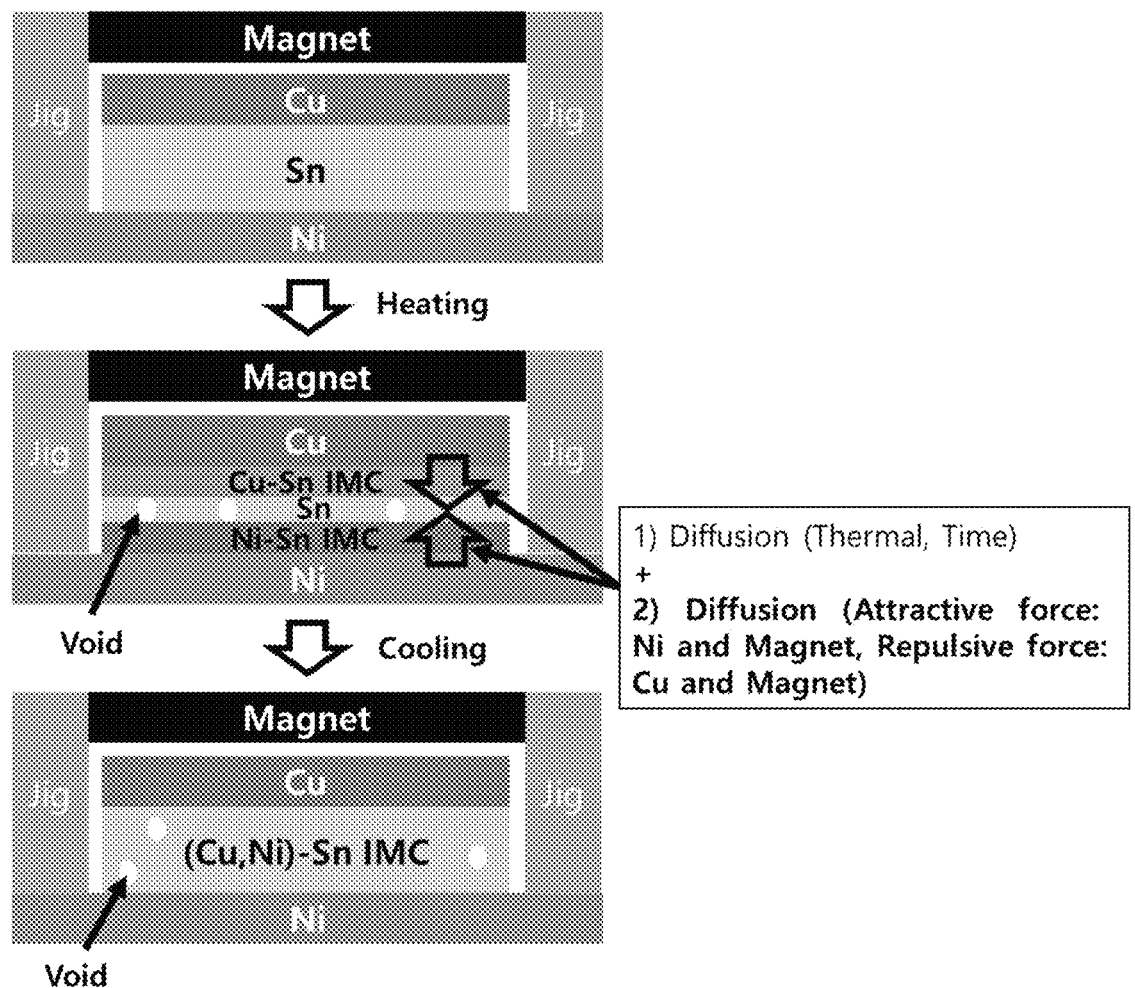
FIG. 6 is a schematic diagram of an unpressurized transient liquid-phase bonding (TLP) method (e.g., Cu to Ni) using a magnetic force according to the present disclosure.

FIG. 6 is a schematic diagram of an unpressurized transient liquid-phase bonding (TLP) method (Cu to Ni) using a magnetic force according to the present disclosure.

As shown in FIG. 6, when a bonding process is performed using a combination of a magnetic force from the magnet and the heat which is conventionally used, the attractive magnetic force acts between the Ni and the magnet while the repulsive magnetic force acts between Cu and the magnet. Thus, 1) the diffusion rate is higher than that of the conventional bonding process, so that the time taken to form an intermetallic compound is shorter. Further, 2) the Kirkendall voids and the voids generated due to the diffusion in the middle of the joint portion may be reduced via diffusion of Ni and Cu using the magnetic force. Finally, 3) Ni diffuses upwardly and Cu diffuses downwardly using the magnetic force, so that the layered structure of the intermetallic compound is not formed in the joint portion, and the (Cu, Ni)—Sn intermetallic compound is evenly and entirely formed. Therefore, higher bonding strength may be obtained.

Figure 7:
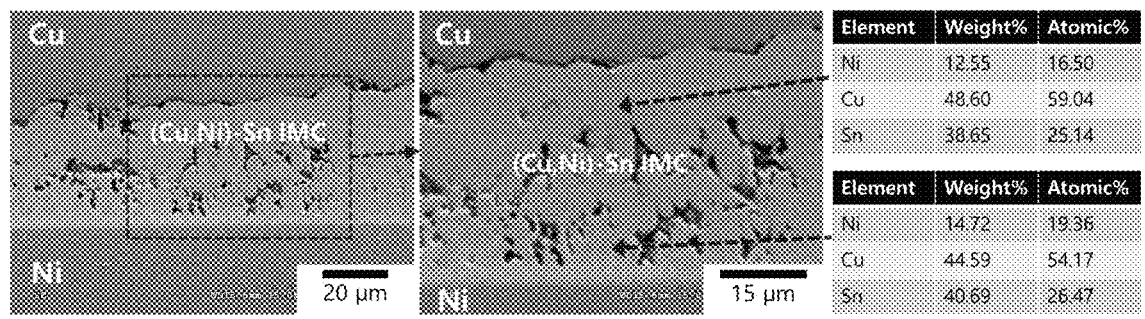
FIG. 7 is an SEM photograph of a bonding result using an unpressurized transient liquid-phase bonding method using a magnetic force according to the present disclosure.

FIG. 7 is a SEM image of a joint portion formed using an unpressurized transient liquid-phase bonding method using a magnetic force according to the present disclosure.

For a test, a base plate as a lower component is made of Ni, a chip as an upper component is made of Cu, and a samarium cobalt magnet enduring against a high temperature is placed above the upper component. In this connection, the magnet may be any magnet that may withstand high temperatures other than the samarium cobalt magnet. A Sn paste is prepared by mixing Sn powders (90 wt %) and a flux (10 wt %) with each other. In this connection, a mixture of additives (dispersants such as PVP, etc.) and solvents (water, alcohol, ethylene glycol, etc.) may be used in place of the flux. Then, the Sn paste is disposed between the upper and lower components. Then, the bonding process is performed at 300 degrees C. for 1 hour in an unpressurized state. It may be identified that the Kirkendall voids and the voids due to vaporization of the organic matter are significantly reduced compared to the conventional method. This is because the diffusion of Ni occurs upwardly and the diffusion of Cu occurs downwardly due to the magnetic force, resulting in a smaller amount of voids. In addition, EDS analysis is performed to identify the layered structure of the joint portion. It is identified that the (Cu, Ni)—Sn IMC is formed in both of the upper and lower regions of the joint portion.

Figure 8:
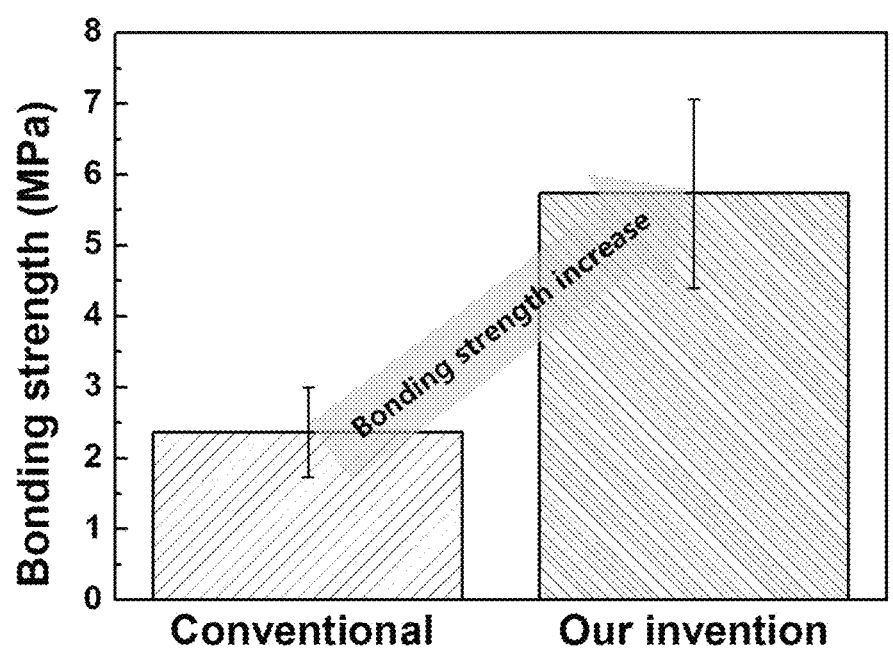
FIG. 8 is a graph of a comparing result between a bonding strength achieved by the conventional bonding method and a bonding strength achieved by a bonding method according to the present disclosure.

FIG. 8 is a graph of a comparing result between a bonding strength achieved by the conventional bonding method and a bonding strength achieved by a bonding method according to the present disclosure. For a test, both of the conventional bonding method and the bonding method according to the present disclosure are performed under the unpressurized condition at 300 degrees C. The bonding strength of the bonding method according to the present disclosure is higher than that of the conventional bonding method by more than 2 times.

First, the bonding method according to the present disclosure may use the magnetic force to shorten a long bonding time which has been the greatest disadvantage of the conventional transient liquid-phase bonding method between the metal materials. Second, the bonding method according to the present disclosure may use the magnetic force to allow the Kirkendall voids, and the voids to be reduced to increase bonding reliability. Third, the bonding method according to the present disclosure may use the magnetic force to disallow the formation of the layered structure of the intermetallic compound in the joint portion in a bonding process between heterogeneous materials. Fourth, in a bonding process between homogeneous magnetic materials, the bonding method according to the present disclosure may use the magnetic force to minimize diffusion of the metal in a chip portion while only a metal in a substrate is diffused, thereby to ensure reliability of a transient liquid-phase joint portion.

Therefore, according to the present disclosure, the electrical interconnection bonding occurring at high temperatures, such as the SiC chip bonding in the electric vehicle power modules and the bonding of the electronic components in aerospace may be realized to reduce the bonding time and obtain the high bonding strength.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A method for transient liquid-phase bonding between metal materials using a magnetic force, the method comprising:
   providing a first base metal being diamagnetic, and providing a second base metal being ferromagnetic;
   mixing a low melting point metal powder having a lower melting point than melting points of the first and second base metals and an organic solvent with each other, thereby preparing a paste;
   stacking the first base metal, the paste, and the second base metal one on top of another in this order;
   placing a magnet on an outer horizontal face of the first base metal; and
   performing a bonding process using heat and a magnetic force at a temperature between the melting points of the first and second base metals and the melting point of the low melting point metal powder.

2. The method of claim 1, wherein the organic solvent includes a flux or a mixture of a dispersant and a solvent.

3. The method of claim 1, wherein the method further comprises placing an electrical wire on the outer horizontal face of the first base metal such that a magnetic force is generated via electric current flowing in the wire.

* * * * *